US008942036B2

United States Patent
Cai et al.

(10) Patent No.: US 8,942,036 B2
(45) Date of Patent: Jan. 27, 2015

(54) METHOD FOR ACHIEVING FOUR-BIT STORAGE USING FLASH MEMORY HAVING SPLITTING TRENCH GATE

(75) Inventors: Yimao Cai, Beijing (CN); Ru Huang, Beijing (CN); Shiqiang Qin, Beijing (CN); Poren Tang, Beijing (CN); Yu Tang, Beijing (CN); Shenghu Tan, Beijing (CN); Xin Huang, Beijing (CN); Yue Pan, Beijing (CN)

(73) Assignee: Peking University, Beijing (CN)

( * ) Notice: Subject to any disclaimer, the term of this patent is extended or adjusted under 35 U.S.C. 154(b) by 47 days.

(21) Appl. No.: 13/499,596

(22) PCT Filed: Oct. 14, 2011

(86) PCT No.: PCT/CN2011/080773
§ 371 (c)(1),
(2), (4) Date: Mar. 30, 2012

(87) PCT Pub. No.: WO2012/051917
PCT Pub. Date: Apr. 26, 2012

(65) Prior Publication Data
US 2012/0188821 A1 Jul. 26, 2012

(30) Foreign Application Priority Data
Oct. 14, 2011 (CN) .......................... 2010 1 0523322

(51) Int. Cl.
*G11C 11/40* (2006.01)
*H01L 29/423* (2006.01)
(Continued)

(52) U.S. Cl.
CPC ...... *H01L 29/42352* (2013.01); *G11C 16/0475* (2013.01); *H01L 29/7887* (2013.01); *H01L 29/7923* (2013.01)
USPC .................................................. 365/185.03

(58) Field of Classification Search
USPC .................................................. 365/185.03
See application file for complete search history.

(56) References Cited

U.S. PATENT DOCUMENTS

| 5,411,905 A * | 5/1995 | Acovic et al. ............ 438/156 |
| 5,753,951 A * | 5/1998 | Geissler ............... 257/316 |

(Continued)

FOREIGN PATENT DOCUMENTS

| CN | 1805146 A | 7/2006 |
| CN | 1812130 A | 8/2006 |

(Continued)

OTHER PUBLICATIONS

Alvaro Padilla, "Enhanced Endurance of Dual-bit SONOS NVM Cells using the GIDL Read Method", 2008, IEEE, 2008 Symposium on VLSI Technology Digest of Technical Papers, pp. 142-143.*

(Continued)

*Primary Examiner* — Hoai V Ho
*Assistant Examiner* — Jay Radke
(74) *Attorney, Agent, or Firm* — Snell & Wilmer LLP

(57) ABSTRACT

The present invention discloses a method for achieving four-bit storage by using a flash memory having a splitting trench gate. The flash memory with the splitting trench gate is disclosed in a Chinese patent No. 200710105964.2. At one side that each of two trenches is contacted with a channel, a programming for electrons is achieved by using a channel hot electron injection method; and at the other side that each of the two trenches is contacted with a source or a drain, a programming for electrons is achieved by using an FN injection method, so that a function of a four-bit storage of the device is achieved by changing a programming mode. Thus, a performance of the device is improved while a storage density is greatly increased.

3 Claims, 1 Drawing Sheet

(51) Int. Cl.
*G11C 16/04* (2006.01)
*H01L 29/788* (2006.01)
*H01L 29/792* (2006.01)

(56) References Cited

U.S. PATENT DOCUMENTS

| | | | |
|---|---|---|---|
| 5,943,267 A * | 8/1999 | Sekariapuram et al. | 365/185.28 |
| 6,240,015 B1 * | 5/2001 | Chi et al. | 365/185.14 |
| 6,317,360 B1 * | 11/2001 | Kanamori | 365/185.01 |
| 7,394,125 B1 * | 7/2008 | Park et al. | 257/314 |
| 2001/0004332 A1 * | 6/2001 | Eitan | 365/200 |
| 2003/0016561 A1 * | 1/2003 | Lee et al. | 365/185.29 |
| 2003/0156457 A1 * | 8/2003 | Ooishi | 365/185.21 |
| 2003/0169622 A1 * | 9/2003 | Ooishi et al. | 365/185.21 |
| 2004/0027857 A1 * | 2/2004 | Ooishi | 365/185.11 |
| 2005/0169041 A1 * | 8/2005 | Wang | 365/154 |
| 2005/0195637 A1 * | 9/2005 | Martino et al. | 365/149 |
| 2005/0248987 A1 * | 11/2005 | Shone | 365/185.28 |
| 2006/0043457 A1 * | 3/2006 | Baik | 257/314 |
| 2006/0203562 A1 * | 9/2006 | Ogura et al. | 365/185.28 |
| 2007/0063268 A1 * | 3/2007 | Yu et al. | 257/330 |
| 2009/0027967 A1 | 1/2009 | Lee | |
| 2009/0190408 A1 * | 7/2009 | Kux | 365/185.24 |

FOREIGN PATENT DOCUMENTS

| | | |
|---|---|---|
| CN | 1954433 A | 4/2007 |
| CN | 101110449 A | 1/2008 |
| CN | 101354921 | 1/2009 |

OTHER PUBLICATIONS

Boaz Eitan, "NROM: A Novel Localized Trapping, 2-Bit Nonvolatile Memory Cell", Nov. 2000, IEEE, IEEE Electron Device Letters vol. 21, No. 11, pp. 543-545.*

* cited by examiner

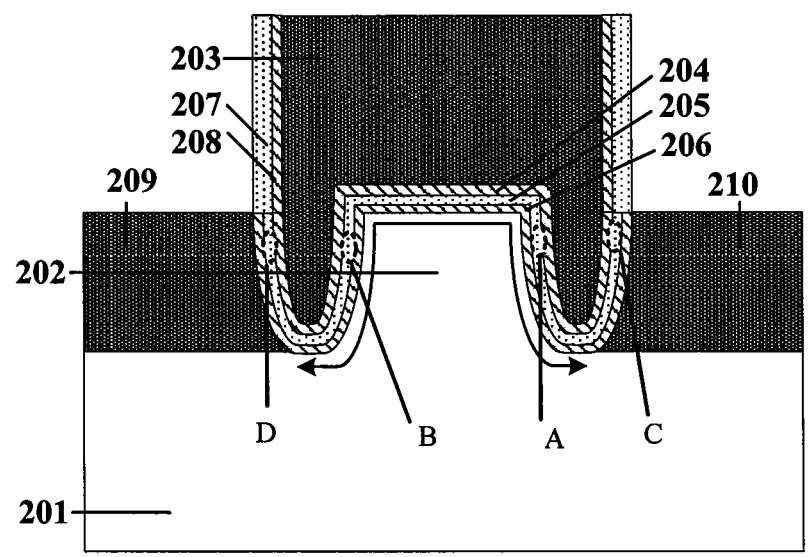

METHOD FOR ACHIEVING FOUR-BIT STORAGE USING FLASH MEMORY HAVING SPLITTING TRENCH GATE

CROSS-REFERENCE TO RELATED APPLICATION

The present application claims priority to Chinese Patent Application (No. 201010523322.6), filed on Oct. 22, 2010 in the State Intellectual Property Office of People's Republic of China, which is incorporated herein by reference in its entirety.

FIELD OF THE INVENTION

The present invention refers to a nonvolatile semiconductor memory in an ultra-large-scale integrated circuit, and particularly relates to a storage method of a multi-bit flash memory having a trench gate structure.

BACKGROUND OF THE INVENTION

As one of most rapidly developing fields in a current semiconductor industry, a semiconductor memory is always a research focus in the industry. Particularly, since various consumer electronic products are widely used today, a requirement for a high performance semiconductor memory is ever-increasing. Among them, a flash memory has occupied a very large share in today's memory market due to its advantages such as a compatibility with a MOS process, an excellent storage performance and etc.

The flash memory in the current market is mainly classified into two types, according to a manner for storing charges. One of the two types is a floating gate flash memory, in which charges are stored in a conductor such as a polysilicon; and the other is a discrete-trap flash memory, in which charges are stored in a silicon nitride trap layer.

In the floating gate flash memory, the stored charges are continuously distributed in the polysilicon floating gate. If there is a leakage path existed in a tunneling oxide layer, all electrons stored in the floating gate may be leaked out through the path. Therefore, in a case that the oxide layer is usually thin in a small size memory, the flash memory having such structure may be faced with a serious problem in terms of reliability.

Meanwhile, in the discrete-trap flash memory, since the charges stored therein are not continuous but localized, when a leakage path occurs in a certain region, only charges located at the path are leaked out, while charges in other regions may be maintained well. Thus, the reliability of the entire memory device is improved to some extent. Particularly, in the case of a small size thin oxide layer, such improvemnet of the reliability is more significant.

In addition to the improvement on the reliability, considering that the charges are not continuously stored in the silicon nitride trap layer, the charges may be stored at both ends of the trap layer to achieve a function of two-bit storage so that a storage density may be increased. However, as a continuous shrink of a process node, an effective channel length of the conventional discrete trap flash memory is increasingly reduced. Since the charges stored at both ends of the channel are close to each other, a very serious problem of crosstalk is existed. To this end, devices having new structures have been proposed to solve the problem. For example, a flash memory with a splitting trench gate disclosed in a Chinese invention patent titled "flash memory having splitting trench gate and method for fabricating the same" (ZL200710105964.2) is one of such devices. The flash memory having the splitting trench gate is a planar structure, as shown in FIG. 1. In this structure, a tunneling oxide layer 206, a silicon nitride trap layer 205, a blocking oxide layer 204 and a polysilicon control gate 203 (or a metal gate) are sequentially disposed over a channel. Two trenches having an identical structure each is disposed between a source 209 and the channel 202 and between a drain 210 and the channel 202, respectively. One side of each of the trenches is contacted with the channel, and the other side of each of the trenches is contacted with the source or the drain, thus the splitting trench gate structure is formed in the channel. The entire channel of the device is formed by a planar channel in middle and two non-planar channels corresponding to the trenches. The trenches and the channel are completely covered by the control gate and the gate stack structure. The control gate has two protruding portions corresponding to the trenches. Under the same number of process nodes, the effective channel length is increased by this device, and the problem of crosstalk between two storage bits is effectively solved.

SUMMARY OF THE INVENTION

An object of the present invention is aimed to meet a huge requirement for a nonvolatile semiconductor memory of a high density in a current electronics market. In the invention, a function of a four-bit storage is achieved by changing a programming mode based on a device structure proposed in a Chinese patent 200710105964.2, so that a performance of the device is improved while a storage density is increased.

A technical solution of the present invention is as follows.

A method for achieving four-bit storage using a flash memory having a splitting trench gate, wherein the flash memory having the splitting trench gate is based on a planar structure; in the flash memory a tunneling oxide layer, a silicon nitride trap layer, a blocking oxide layer and a control gate are sequentially disposed over a channel; two trenches having an identical structure each is disposed between a source and the one end of the channel and between a drain and the other end of the channel, respectively; one side of each of the trenches is contacted with the channel, and the other side of each of the trenches is contacted with the source or the drain; a splitting trench gate structure is formed in the channel; the channel is formed by a planar channel in middle and two non-planar channels corresponding to the trenches; the trenches and the channel are completely covered by the control gate and a gate stack structure comprising the tunneling oxide layer, the silicon nitride trap layer, the blocking oxide layer; and the control gate has two protruding portions corresponding to the trenches; the method being characterized in that, at the one side that each of the two trenches is contacted with the channel (i.e. an inner side that each of the trenches is adjacent to the channel), a programming for electrons is achieved by using a channel hot electron injection (CHEI) method; and at the other side that each of the two trenches is contacted with the source or the drain (i.e. an outer side that each of the trenches is adjacent to the source or the drain), a programming for electrons is achieved by using an FN (Fowler-Nordheim) injection method, so that a four-bit storage is achieved.

A fabrication of the flash memory having the splitting trench gate and a related parameter of the fabrication can be seen in a Chinese patent No. 200710105964.2, titled "flash memory having splitting trench gate and method for fabricating the same", which is incorporated herein by reference in its entirety.

In a conventional discrete-trap flash memory, a programming for electrons is achieved by using a channel hot electron injection method. In general, in order to increase a storage density, a method of exchanging a source and a drain is typically used, so that a two-bit programming is achieved at both ends adjacent to the source and the drain.

In the present invention, the conventional method are also used by the flash memory with the splitting trench gate, so that electrons are injected into a silicon nitride trap layer at an inner side that each of the trenches is adjacent to a channel (see a region A and a region B in FIG. 1). As such, a storage function is achieved by such a localized injection and storage. In order to achieve a two-bit programming, a definition of the source and the drain during a read operation is opposite to a case during a program operation; a small voltage is applied to the control gate; and a drain current is read under a condition that an error programming is not occurred. Thus, a storage state is determined according to a magnitude of the drain current. If electrons are stored in the silicon nitride trap layer at the inner side of each of the trenches, the drain current is small; and if no electrons are stored in the silicon nitride trap layer at the inner side of each of the trenches, the drain current is large.

Furthermore, in the present invention, an FN programming method for the flash memory with the splitting trench gate is performed, so that the electrons are injected at an outer side that each of the trenches is adjacent to the source and the drain (see a region C and a region D in FIG. 1), and thus the electrons are stored in the silicon nitride trap layer at the outer side of each of the trenches. Because of the electrons stored in the silicon nitride trap layer at the outer side of each of the trenches, a gate-induced-drain-leakage (GIDL) current by read has a significant difference from a case that no electrons are stored the silicon nitride trap layer at the outer side of each of the trenches. Thus, two bits each are stored in the silicon trap layer at the outer side of each of the two trenches, respectively.

The electrons stored in the silicon nitride trap layer at the outer side and the inner side of each of the trenches may be erased by an FN method. In particular, an appropriate negative voltage is applied to the control gate, and an appropriate positive voltage are applied the source, the drain, and the substrate respectively, so that both of the electrons stored in the silicon nitride trap layer at the outer side of each of the trenches and the electrons stored in the silicon nitride trap layer at the inner side of each of the trenches may be erased.

When an FN injection method is used for the outer side of each of the two trenches and a channel hot electron injection method is used for the inner side of each of the two regions, the charges are stored in the silicon nitride trap layer at four regions. By means of the electrons stored in the silicon nitride trap layer at the inner side of each the trenches, a channel current has a difference from a case that no charges are stored; and by mean of the electrons stored in the silicon nitride trap layer at the outer side of each of the trenches, a channel current has a difference from a case that no charges are stored. Therefore, a function of a four-bit storage is achieved in a same memory cell.

BRIEF DESCRIPTION OF THE DRAWINGS

FIG. 1 is a schematic diagram of a cross-sectional structure of a flash memory having a splitting trench gate, in which:
201 a bulk silicon substrate (P-doped);
202 a channel having a splitting trench gate structure (divided into three parts, i.e. two non-planar channels each corresponding to each of the trenches, located at both ends; and one planar channel in middle);
203 a control gate (having two protruding portions corresponding to the trenches);
204 a blocking oxide layer;
205 a silicon nitride trap layer;
206 a tunneling oxide layer;
207 a silicon nitride sidewall;
208 a silicon oxide sidewall;
209 an n+ source terminal (or a drain terminal);
210 an n+ drain terminal (or a source terminal).

DETAILED DESCRIPTION OF THE EMBODIMENTS

Hereinafter, a disclosure of the present invention is further described in more detail through embodiments.

A practical operation of the present invention is illustrated with respect to two cases, in which one case is storage bits of a silicon nitride trap layer at an inner side of a trenches, and the other is storage bits of a silicon nitride trap layer at an outer side of a trench.

1. Storage bits of the silicon nitride trap layer at the inner side of the trench Programming:

A device as shown in FIG. 1 has a symmetric structure. Thus, either of the n+ region 209 or 210, which are disposed at both ends of the device, may be used as a source or a drain. When a region A is to be programmed, the region 210 is used as the drain, and the region 209 is used as the source. When programming, a positive voltage Vd (about 4V) is applied to the drain terminal 210; the source terminal is grounded; a relatively high positive voltage Vg (about 12V) is applied to the control gate; and the substrate may be grounded or a negative voltage may be applied thereto (for increasing a programming efficiency). Under such voltage biases, an electron current flowing from the source terminal 209 to the drain terminal 210 is generated in the channel, in which a portion of the electrons may obtain enough energy to cross a barrier of Si—SiO2 (about 3.2 eV) and enter into the silicon nitride trap layer in the region A. As such, a programming for the region A is completed.

Likewise, a similar method may be applied to a programming for the silicon nitride trap layer in the region B, which is located at a symmetric position with respect to the region A, except that here the drain terminal is the region 209 and the source terminal is the region 210. In the same manner, a programming for the silicon nitride trap layer in the region B is achieved.

Reading:

As for reading the storage bits of the silicon nitride trap layer at the inner side of the trench, definitions of the source and the drain, which are determined during the programming, are to be exchanged, and then a drain current under appropriate biases is read.

When reading a state of storage bits of the silicon nitride trap layer in the region A, the region 209 is used as the drain, and the region 210 is used as the source. A relatively small positive voltage Vd (about 1V) is applied to the drain region 209; the source region 210 is grounded; the substrate 201 is grounded; and an appropriate positive voltage is applied to the control gate 203. A magnitude of the current of the drain terminal 209 is measured as a state of the storage bits of the region A. In particular, when the storage bits of the region A have electrons stored therein, a threshold voltage of the device is high, and the read drain current is small, which is noted as a logic state "1"; and when the storage bits of the region A have no electrons stored therein, a threshold voltage of the device is low, and the read drain current is large, which is noted as a logic state "0". As such, reading the storage bits of the region A may be achieved.

Likewise, a similar method as above may be applied to a reading for a state of the symmetric region B, except that here the region 210 is used as the drain and the region 209 is used as the source.

2. Storage bits of the silicon nitride trap layer at the outer side of the trench Programming:

A programming for the silicon nitride trap layer at the outer side of the trench is performed by using an FN injection method.

When programming the silicon nitride trap layer in the region C, a positive voltage Vg (the higher the Vg is, the faster the programming speed is) is applied to the control gate 203; the region 210 is grounded or a negative voltage (the more negative the voltage is, the faster the programming speed is) is applied thereto; and other terminals are floated. As such, by way of the FN tunneling, some of the electrons may enter into the silicon nitride trap layer in the region C.

Likewise, a similar method as above may be applied to a programming for the silicon nitride trap layer in the region D, except that here the voltage that was applied to the region 210 is applied to the region 209; the region 210 is changed to be floated; and biases of the other terminals are the same as a case of programming the region C.

Reading:

A storage state of the storage bits of the silicon nitride trap layer at the outer side of the trench is determined by way of reading a gate-induced drain leakage (GIDL) current.

When reading the region C, a negative bias is applied to the control gate 203; the region 210 is applied a positive voltage; the substrate is grounded; and the region 209 is floated. At this time, whether the region C has electrons stored therein may be determined by the read drain current. If the silicon nitride trap layer of the region C has electrons stored therein, the read drain current is small, which is noted as a logic state "1". If the silicon nitride trap layer in the region C has no electrons stored therein, the read drain current is large, which is noted as a logic state "0".

A storage state of the region D may be read by using a similar method as above, in which a negative bias is applied to the control gate 203; a positive bias applied to the region 209; the region 210 is floated; and the substrate is grounded.

Erasing:

An erasing of the entire device is obtained by an FN tunneling method. When a negative voltage is applied to the control gate; and the source, and the drain and the substrate are grounded or an appropriate positive voltage is applied thereto respectively, electrons stored in the silicon nitride trap layer are erased by the FN tunneling, so that the erasing of the entire device is achieved.

A practical operation process is not limited the above bias conditions. Under the above-mentioned basic operation principles, variations may be made by those skilled in the art (e.g., a negative voltage and etc. may be applied to the substrate when reading the region C) according to actual situations. The variations are all within the scope of the present invention.

What is claimed is:

1. A method for achieving four-bit storage using a flash memory having a splitting trench gate, wherein the flash memory having the splitting trench gate is based on a planar structure including: a tunneling oxide layer, a silicon nitride trap layer, a blocking oxide layer and a control gate sequentially disposed over a channel; two trenches having an identical structure each disposed between a source and the channel and between a drain and the channel, respectively, wherein one side of each of the trenches contacts the channel, and the other side of each of the trenches contacts the source or the drain; a splitting trench gate structure formed in the channel, which is formed by a planar channel in the middle and two non-planar channels corresponding to the trenches; the trenches and the channel completely covered by the control gate and a gate stack structure that includes the tunneling oxide layer, the silicon nitride trap layer and the blocking oxide layer; and the control gate having two protruding portions corresponding to the trenches, the method comprising:

achieving the storing of first and second bits by programming electrons at one side of each of the two trenches that contacts the channel by using a channel hot electron injection method;

achieving the storing of third and fourth bits by programming electrons at the other side of each of the two trenches that contacts the source or the drain by using an FN tunneling injection method, wherein the tunneling oxide layer is configured as a tunneling channel and the silicon nitride trap layer is configured to store electrons; and determining storage states of the third and fourth bits by reading a gate-induced drain leakage current at the other side of each of the two trenches that contacts the source or the drain.

2. The method according to claim 1, further comprising performing a read operation for the one side of each of the two trenches that contacts the channel, wherein a definition of the source and the drain is to be opposite to that in the program operation, and a storage state is determined by reading a drain current.

3. The method according to claim 1, further comprising erasing the entire device by an FN tunneling method.

* * * * *

UNITED STATES PATENT AND TRADEMARK OFFICE
CERTIFICATE OF CORRECTION

PATENT NO.         : 8,942,036 B2                                        Page 1 of 1
APPLICATION NO.    : 13/499596
DATED              : January 27, 2015
INVENTOR(S)        : Yimao Cai et al.

It is certified that error appears in the above-identified patent and that said Letters Patent is hereby corrected as shown below:

On the Title Page
  Foreign Application Priority Data should read as follows:

(30) Oct. 22, 2010 (CN) ..............................2010 1 0523322

Signed and Sealed this
Third Day of November, 2015

Michelle K. Lee
*Director of the United States Patent and Trademark Office*